United States Patent [19]
Aruga et al.

[11] Patent Number: 6,027,618
[45] Date of Patent: *Feb. 22, 2000

[54] COMPACT IN-LINE FILM DEPOSITION SYSTEM

[75] Inventors: Yoshiki Aruga; Yo Kamikura, both of Tokyo, Japan

[73] Assignee: Anelva Corporation, Fuchu, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/957,767

[22] Filed: Oct. 24, 1997

Related U.S. Application Data

[62] Division of application No. 08/606,038, Feb. 22, 1996, Pat. No. 5,846,328.

[30] Foreign Application Priority Data

Mar. 30, 1995 [JP] Japan ................................... 7-99648

[51] Int. Cl.$^7$ ............................. C23C 14/34; C23C 16/00
[52] U.S. Cl. ................................. 204/192.12; 427/248.1; 427/255.5
[58] Field of Search .................... 204/192.12, 298.25, 204/192.32, 298.35; 118/718, 719; 414/935, 937, 939; 427/569, 248.1, 255.5

[56] References Cited

U.S. PATENT DOCUMENTS

| | | |
|---|---|---|
| 2,730,987 | 1/1956 | Nelson . |
| 4,261,808 | 4/1981 | Walter .............................. 204/298.25 |
| 4,500,407 | 2/1985 | Boys et al. . |
| 4,643,629 | 2/1987 | Takahashi et al. ................. 204/298.25 |
| 4,674,621 | 6/1987 | Takahashi ......................... 204/298.25 |
| 4,722,298 | 2/1988 | Rubin et al. . |
| 4,795,299 | 1/1989 | Boys et al. ........................ 204/298.25 |
| 4,825,808 | 5/1989 | Takahashi et al. ...................... 118/719 |
| 4,981,408 | 1/1991 | Hughes et al. . |
| 5,024,570 | 6/1991 | Kiriseko et al. . |
| 5,047,130 | 9/1991 | Akao et al. . |
| 5,076,205 | 12/1991 | Vowles et al. . |
| 5,277,778 | 1/1994 | Daube et al. ...................... 204/298.26 |
| 5,288,329 | 2/1994 | Nakamura et al. . |
| 5,376,212 | 12/1994 | Saiki . |
| 5,377,816 | 1/1995 | Deligi et al. ....................... 204/298.23 |
| 5,482,607 | 1/1996 | Hashimoto et al. ............... 204/298.25 |
| 5,651,868 | 7/1997 | Canady et al. . |
| 5,695,564 | 12/1997 | Imahashi . |

FOREIGN PATENT DOCUMENTS

| | | |
|---|---|---|
| 2900724 | 7/1980 | Germany . |
| 59-228932 | 12/1984 | Japan . |
| 61-170568 | 8/1986 | Japan . |
| 62-20347 | 1/1987 | Japan . |
| 62-230977 | 10/1987 | Japan . |
| 63-161636 | 7/1988 | Japan . |
| 63-303062 | 12/1988 | Japan . |
| 1-230250 | 9/1989 | Japan . |
| 4-115513 | 4/1992 | Japan . |
| 4-275449 | 10/1992 | Japan . |

OTHER PUBLICATIONS

Anelva, Disk Sputtering System C–3010, New Product, Aug. 1995.

*Primary Examiner*—Nam Nguyen
*Assistant Examiner*—Gregg Cantelmo
*Attorney, Agent, or Firm*—Burns, Doane, Swecker & Mathis, LLP

[57] ABSTRACT

An in-line film deposition system is adapted so that film deposition processing on a substrate is completed through a number of film deposition processes, while the length of the system is not excessive. A carrier 3 which holds two substrates 1, with their planar surfaces set parallel to a transfer direction, is sequentially transferred through a plurality of vacuum chambers 2 arranged along a polygonally-shaped transfer path 30. Film deposition processing is continuously carried out on the substrate 1 by processing means 4 that are arranged in the vacuum chambers 2 which form film deposition process chambers. A rotation mechanism for rotating the carrier 3 through a specified angle so as to direct the carrier 3 in a subsequent transferring direction is provided in those vacuum chambers which are located at turning points along the polygonal transfer path 30.

17 Claims, 9 Drawing Sheets

ENTERING POSITON UPON PICKING UP A SUBSTRATE

SUBSTRATE TRANSFER POSITION ON ROBOT

COMPACT IN-LINE FILM DEPOSITION SYSTEM

This application is a divisional, of application Ser. No. 08/606,038 filed Feb. 22. 1996, now U.S. Pat. No. 5,846,328, issued Dec. 8, 1998.

BACKGROUND OF THE INVENTION

1. Field of the Invention

The present invention relates to an in-line film deposition system for sequentially transferring substrates to a plurality of vacuum chambers that are arranged along a substrate transfer path, and for carrying out film deposition on these substrates.

2. Description of Related Art

An in-line film deposition system that includes a plurality of vacuum chambers arranged along a linear transfer path has been used as a film deposition system for large-scale production.

FIG. 9 is a schematic plan view of a conventional in-line film deposition system. The in-line film deposition system shown in FIG. 9 comprises a plurality of vacuum chambers 2' arranged along a transfer path 30'. The substrates are positioned in a carrier 3' and transferred by a transfer system, not shown, to vacuum chambers 2' along the transfer path 30'. Processing means 4' are provided in each vacuum chamber 2' for performing film deposition processing.

A plurality of vacuum chambers 2', each of which is enclosed within a rectangular parallelepiped vacuum container 20', are arranged along the linear transfer path 30'. In the upstream and downstream walls of each of the vacuum containers 20' along the transfer path 30' are openings through which the substrate is passed. These openings are provided with gate valves 21'.

Processing means 4' are provided in side walls of the vacuum containers 20', which are parallel to the transfer direction. For film deposition by sputtering, the processing means 41' is provided with a cathode mechanism having a target. Such processing means 4' are generally disposed in a plurality of vacuum chambers 2' to carry out a plurality of film deposition processing procedures on the substrate. Such a plurality of film deposition processing procedures are suitable for the deposition of a multi-layer film comprising a plurality of layers, and for preliminary processing such as heating and cleaning of the substrate.

"Film deposition processing" cited in this specification includes not only literal "film deposition" processing but also other processing which is carried out before and after "film deposition".

The vacuum chamber 2' which is provided the furthest upstream along the transfer path 30' is used as an auxiliary chamber for loading the substrate. The vacuum chamber 2' that is provided the furthest downstream is used as an auxiliary chamber for unloading the substrate. The substrate is held on the carrier 3' and is sequentially transferred to respective vacuum chambers 2' through the gate valves 21'. Specified steps of film deposition processing are carried out in sequence on the surface of the substrate by the processing means disposed in each vacuum chamber 2'.

The conventional in-line film deposition system as described above and illustrated in FIG. 9 is advantageous in that the substrate is not exposed to the air between processing steps and a high quality thin film can therefore be deposited on the substrate.

However, the conventional in-line film deposition system as described above is disadvantageous in that the system is excessively long since the vacuum chambers 2' are arranged in a straight line. Accordingly, the floor space that is occupied by the system in a clean room becomes excessively large. In addition, in the case of the conventional in-line film deposition system, the auxiliary chamber for loading the substrate is located distant from the auxiliary chamber for unloading the substrate. Accordingly, the load-unload operations for the substrate cannot be carried out at one position in the system.

SUMMARY OF THE INVENTION

The present invention addresses the problems described above and provides a compact in-line film deposition system that is capable of loading and unloading a substrate at one position.

To achieve the above object, the in-line film deposition system according to the present invention has a looped line transfer path along which a carrier that is loaded with a substrate is moved. Along the looped line transfer path are arranged a plurality of vacuum chambers. The vacuum chambers which are arranged along the transfer path include vacuum chambers for processing the substrate. In addition, the vacuum chambers at turning points in the transfer path are provided with rotation mechanisms for changing the direction of the carrier. Moreover, the vacuum chamber for loading the substrate is disposed adjacent to the vacuum chamber for unloading the substrate.

The rotation mechanism comprises a holding member, which holds a drive mechanism, including a magnetic coupling roller that is to be magnetically coupled with the carrier, and a motor for rotating the holding member.

The substrate is loaded onto the carrier so that the surface of the substrate is set parallel to the transfer direction. Actually, at least two substrates are preferably loaded on the carrier. The carrier travels along via a transfer system including the magnetic coupling roller, which is magnetically coupled with the carrier, and the rotation mechanism, which rotates the magnetic coupling roller.

Processing means are provided in each of the respective vacuum chambers for processing the substrate so as to face the surface of the substrate that is to be processed. In the vacuum chamber for processing two substrates, two sets of processing means are arranged opposite each other with the transfer path in between. The processing means perform sputtering, etching, heating or cooling of the substrate.

Vacuum transfer robots are arranged in the vacuum chamber for loading the substrate and in the vacuum chamber for unloading the substrate. It is also preferable that the loading and unloading of the substrate be carried out in one vacuum chamber.

Spaces through which an operator may pass are preferably formed under some of the vacuum chambers arranged along the transfer path. It is preferable that the transfer path of the in-line film deposition system according to the present invention be square-shaped.

BRIEF DESCRIPTION OF THE DRAWINGS

The invention will be described in greater detail with reference to the accompanying drawings in which like elements bear like reference numerals, and wherein:

FIG. 10(*b*) is a perspective view of the hook for the arm of the transfer robot.

DETAILED DESCRIPTION OF THE PREFERRED EMBODIMENTS

Figure 1A:
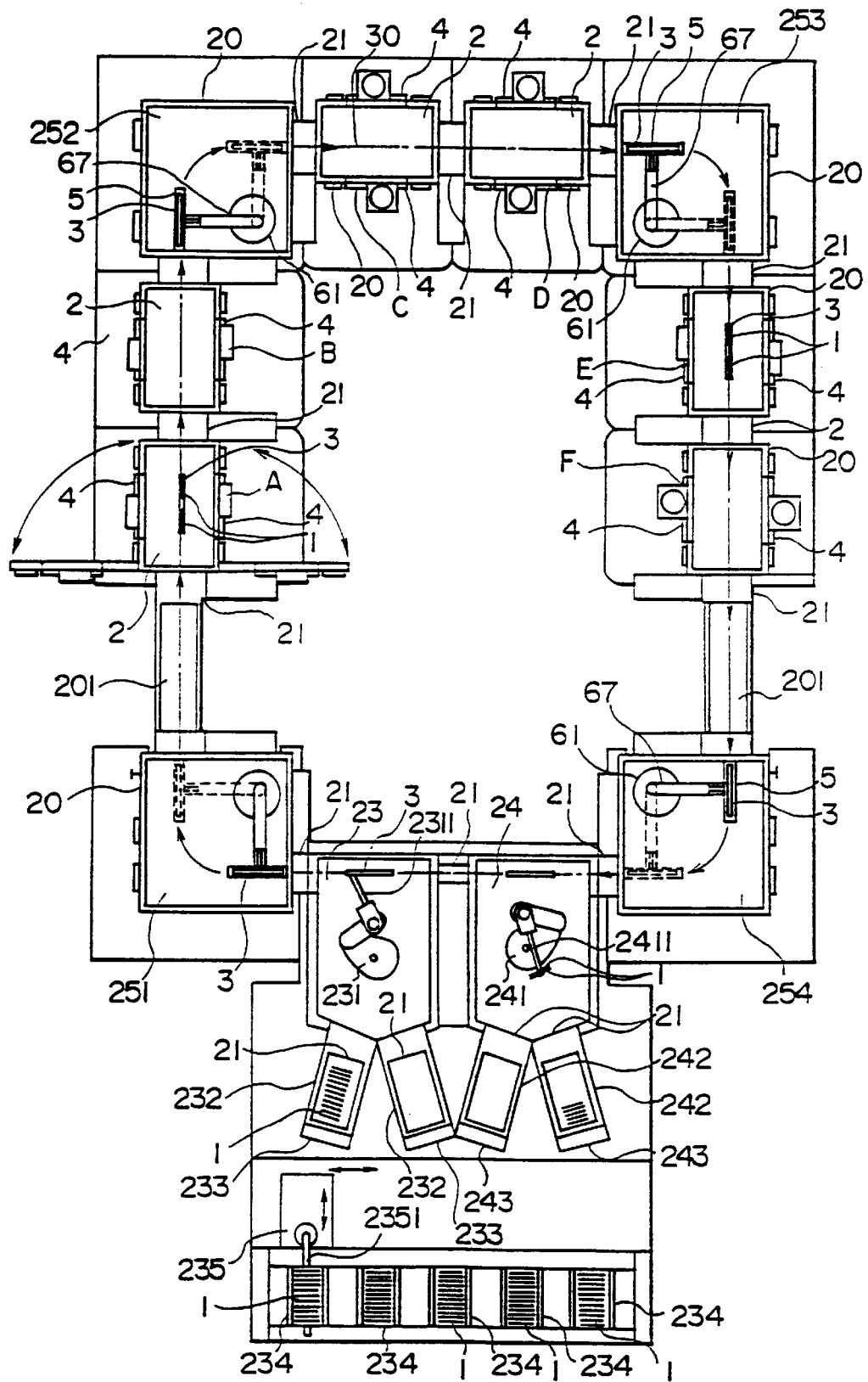
FIG. 1(a) is a schematic plan view of an in-line film deposition system according to a preferred embodiment of the present invention.
Figure 1:
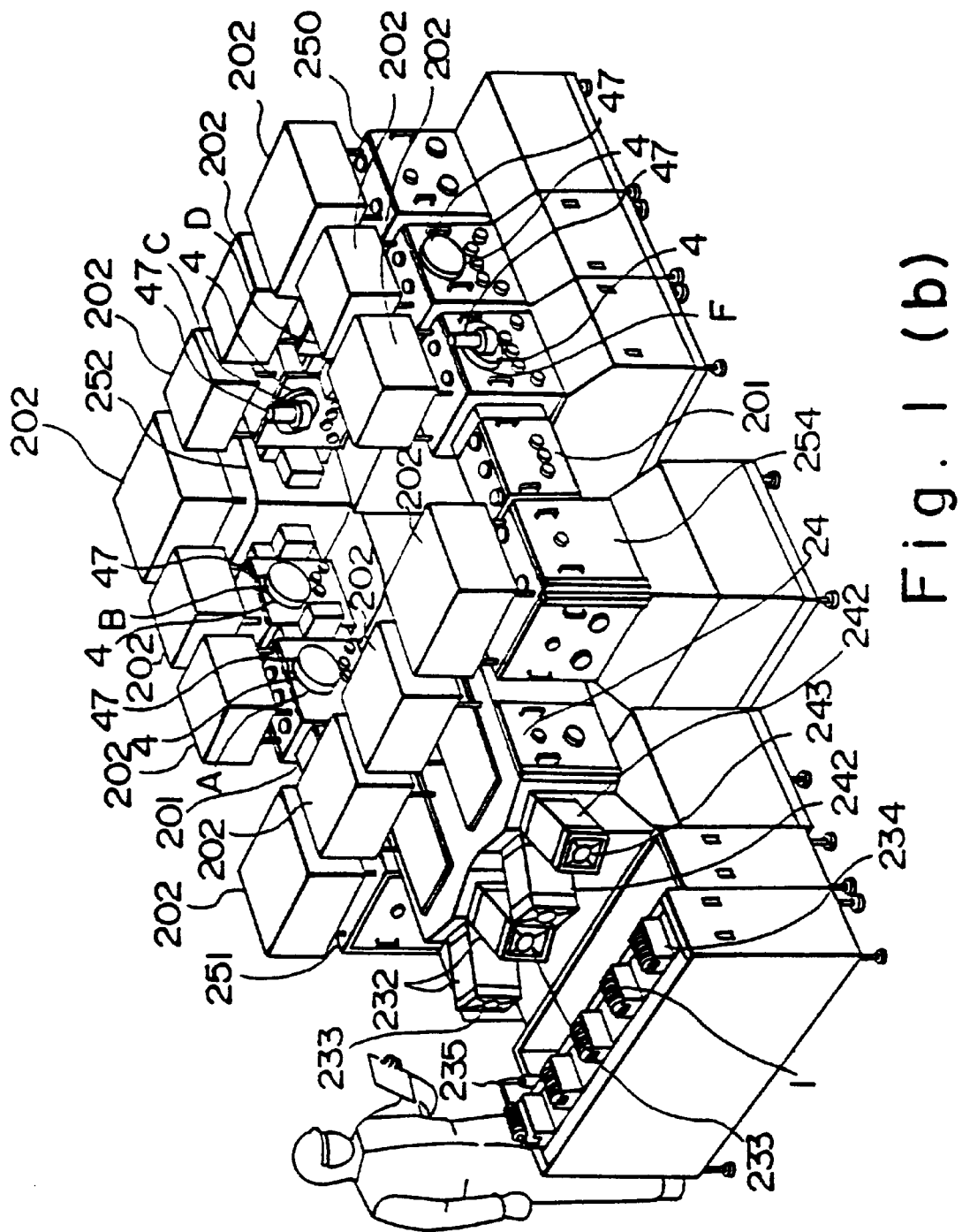
FIG. 1(b) is a perspective view of the in-line film deposition system according to the preferred embodiment of the present invention.

FIG. 1(*a*) is a schematic plan view of an in-line film deposition system according to the present invention. FIG. 1(*b*) is a perspective view of the in-line film deposition system. The in-line film deposition system shown in FIGS. 1(*a*) and 1(*b*) includes a plurality of vacuum chambers 2 which are arranged along a square-shaped transfer path 30, and a transfer system for transferring a carrier 3 along the square-shaped transfer path 30. The carrier 3 is loaded with two substrates 1 with their surfaces being directed parallel to the transfer direction. Accordingly, as the substrates 1 are transferred along the transfer path 30 their surfaces are kept facing the sides of the vacuum chambers 2.

As is shown in FIGS. 1(*a*) and 1(*b*), the transfer path 30 is a substantially rectangular shaped looped line. Along the transfer path 30 are arranged fourteen vacuum containers 20. The carrier 3 travels along the transfer path 30 on a transfer system that is not shown in FIGS. 1(*a*) and 1(*b*).

An exhaust system, not shown, is independently provided in each of the vacuum containers 20 except for the vacuum chambers 201. Of the respective vacuum chambers 2, those vacuum chambers 2 which are arranged on three sides of the square-shaped transfer path 30 are processing chambers. At four corners of the rectangular shaped transfer path are arranged rotation chambers 251, 252, 253 and 254. The rotation chambers 251, 252, 253 and 254 are each provided with a rotation mechanism to change a traveling direction of the carrier 3.

Gate valves 21 are provided between the vacuum chambers 2. When the gate valves 21 open, the carrier 3 passes through to the next vacuum chamber 2 along the transfer path 30. The gate valves 21 close to seal the vacuum chambers 2 so as to establish independent vacuum atmospheres in each of the vacuum chambers. There is no gate valve provided between the rotation chambers 251, 254 and the adjacent vacuum chambers 201. The vacuum chambers 201 are vacuum-evacuated by the exhaust systems provided in the adjacent rotation chambers 251, 254.

A configuration of the carrier 3 employed in the system shown in FIGS. 1(*a*) and 1(*b*) is described below, with reference to FIG. 2 which is a schematic front view of the carrier 3 and the transfer system, and FIG. 3 which is a schematic cross sectional plan view of the carrier 3 taken along line A—A of FIG. 2.

The carrier 3 in this embodiment simultaneously holds two substrates 1. The carrier 3 shown in FIG. 2 includes a plate-shaped carrier body 31. The plate-shaped carrier body 31 for holding the substrate 1 has two cutouts of the shape shown in FIG. 2. Finger plates 32, 33, 34 and 35 for fixing the substrate are attached to the internal edges of the two cutouts. A carrier side magnet 39 for transferring the substrate is disposed on the lower edge of the carrier body 31. The carrier body 31 is arranged in the vacuum chambers 2 vertically with the surface of the carrier body 31 parallel to the substrate transfer direction.

The finger plates 32, 33, 34 and 35 hold the substrate 1 parallel to the plate surface of the carrier 3. Finger plates 32 and 35 support the substrate 1 at the lower edge of the substrate 1, which is vertically held. Another two finger plates 33 and 34 hold the substrate 1 between them approximately at the center of the height of the substrate 1.

Figure 3:
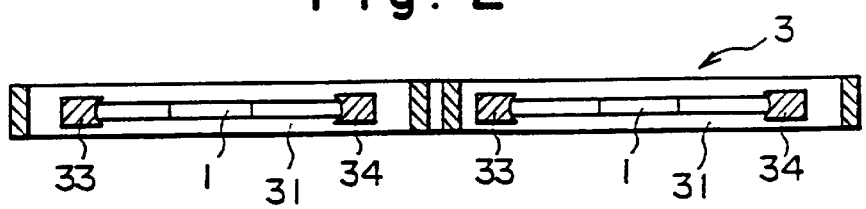
FIG. 3 is a schematic cross sectional view of a carrier taken along line A—A in FIG. 2.

As shown in FIG. 3, grooves, which are U-shaped or V-shaped in cross section, are formed at the ends of respective finger plates 32, 33, 34 and 35. The edge of the substrate 1 is fitted into these U-shaped or V-shaped grooves and the substrate 1 is held in a vertical position. Finger plates 32, 33, 34 and 35, which come into contact with the substrate 1, are electrically grounded. Accordingly, if the substrate 1 is made of a metal, the substrate 1 is also grounded when it is loaded onto the carrier 3. The substrate 1 is heated to approximately 350° C., as is described later, and therefore the component members of the carrier 3 are made of a material, such as stainless steel, that is sufficiently durable at this temperature.

Figure 4:
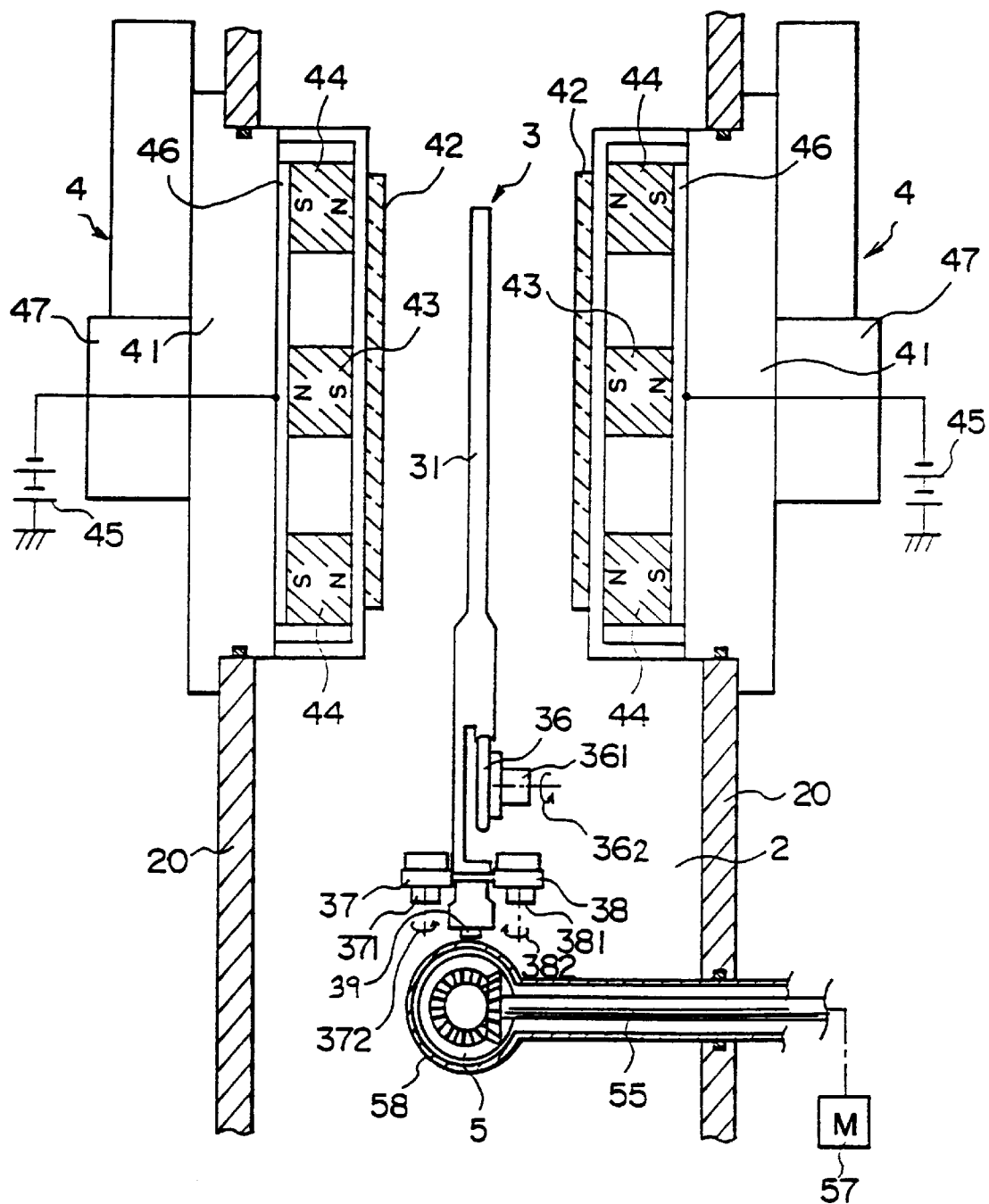
FIG. 4 is a schematic side view of the carrier, the transfer system and the processing means for the in-line film deposition system of FIG. 1.

The transfer system is described below, with reference to FIGS. 2 and 4. FIG. 4 is a schematic side view of the carrier 3, the transfer system, and the processing means 4.

The transfer system of this embodiment allows the substrate 1 to be transferred with the substrate surface kept parallel to the transfer direction. In other words, the substrate 1 is moved laterally along in the transfer direction. The transfer system includes a magnetic coupling roller 5, which is to be magnetically coupled to the carrier 3, and a rotation mechanism, for moving the carrier 3 by rotating this magnetic coupling roller 5.

Figure 2:
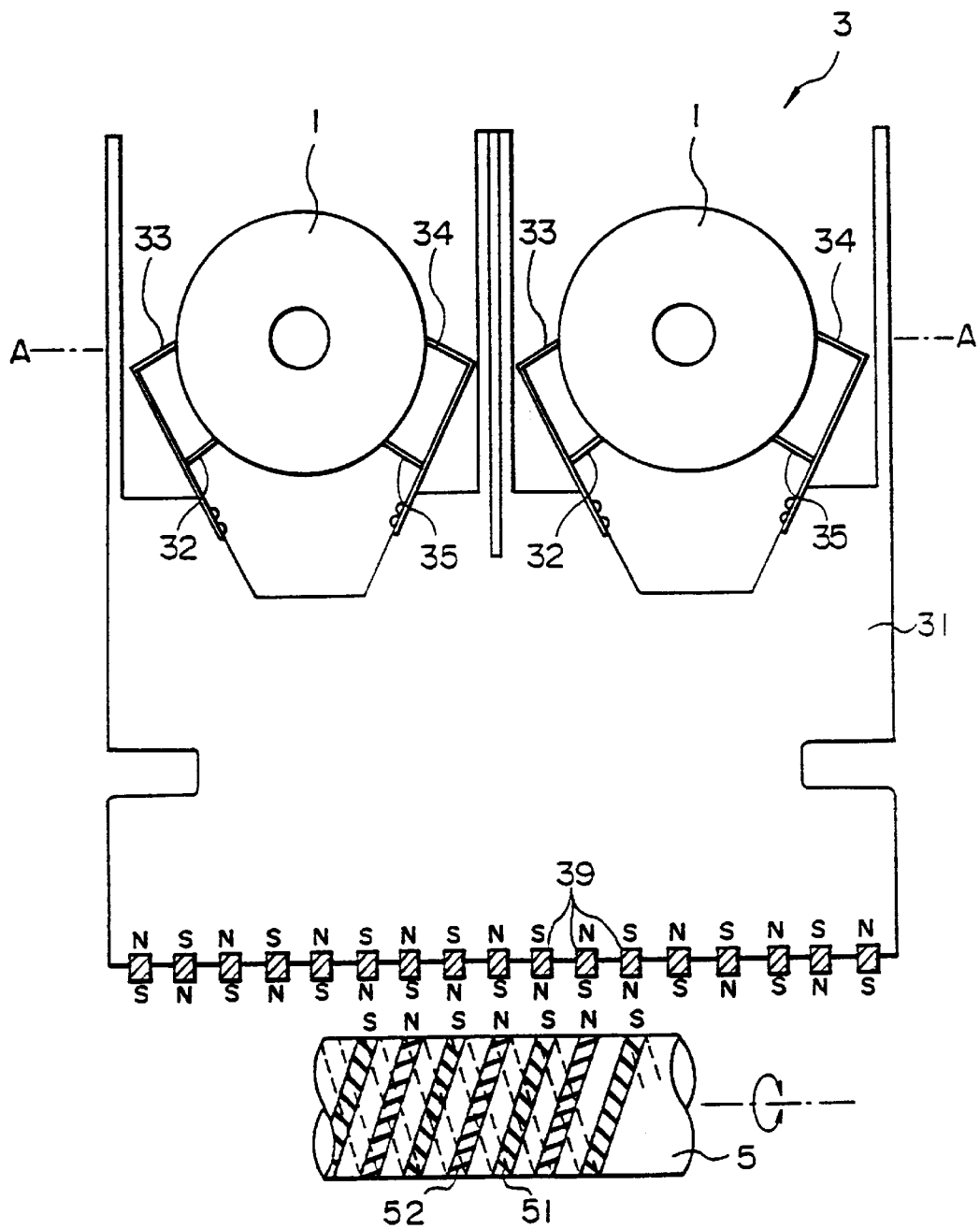
FIG. 2 is a schematic front view of a carrier and a transfer system for the in-line film deposition system of FIG. 1.

The magnetic coupling roller 5 is arranged along the transfer direction as shown in FIG. 2. This magnetic coupling roller 5 is a cylinder around which spiral magnetic poles 51 and 52 are formed as shown in FIG. 2. These spiral magnetic poles 51 and 52 are formed by magnetizing two spirals formed on the surface of the cylinder to opposite polarities as shown in FIG. 2. As shown in FIG. 2, the two spiral magnetic poles 51 and 52 are respectively S and N poles.

As shown in FIG. 2, carrier side magnets 39 are small rectangular parallelepiped magnets of alternating polarities. The carrier side magnets 39 are provided at the lower edge of the carrier body 31 with the same spacing or pitch as the magnetic poles 51 and 52 of the coupling rollers. The carrier side magnets 39 are arranged so that the polarities provided at their lower surfaces are opposite to the polarities of the magnetic poles 51 and 52. An external cover, not shown in FIG. 2, is disposed between the carrier side magnets 39 and the magnetic coupling roller 5. A clearance between the lower edges of the carrier side magnets 39 and the upper edges of the magnetic poles of the magnetic coupling roller 5 is set to approximately 4 mm.

The magnetic coupling roller 5 having a configuration as described above is provided with a rotation mechanism. The rotation mechanism rotates the magnetic coupling roller 5 around a center of the magnetic coupling roller 5, which serves as the rotational axis. This rotation of the rotation mechanism moves the carrier 3 in the transfer direction.

When the magnetic coupling roller 5 is rotated, the spiral threads of the magnetic poles 51 and 52 rotate and appear to move like the threads of a screw. The carrier side magnets 39 are magnetically coupled with the magnetic poles 51 and 52 of the magnetic coupling roller 5 and therefore the carrier 3 as a whole is moved forward or backward by the rotation of the magnetic coupling roller 5. Accordingly, the substrate 1 held on the carrier is transferred in the transfer direction by the rotation of the magnetic coupling roller 5.

The carrier 3 is supported by three pulleys 36, 37 and 38 which allow it to move in the transfer direction. As shown in FIG. 4, a lower part of the carrier body 31 is cut away as much as approximately half of the plate thickness as viewed from the transfer direction to receive a pulley 36. The pulley 36 which supports the carrier body 31 from beneath, is arranged in this cut away portion of the carrier body 31. The pulley 36 rotates in the direction of arrow 362 while being held by a shaft 361. The surface of the carrier body 31, which comes into contact with the pulley 36 at the cut out portion of the carrier body 31, has an inverted U-shaped or V-shaped cross section. The pulley 36 engages this inverted U-shaped or V-shaped edge.

A pair of right and left side holding pulleys 37 and 38 are arranged at the lower end of the carrier body 31 such that the carrier body 31 is held between them. The pair of holding pulleys 37 and 38 are rotated in the directions of arrows 372 and 382 while being held by the shafts 371 and 381.

Pulleys 36, 37 and 38 are trailing pulleys which rotate in unison with the movement of the carrier body 31. The rotation mechanism of the pulleys 36, 37 and 38 is preferably a vacuum bearing so that no dust particulate is produced in the vacuum chambers 2. The material of the portions of the carrier body 31 which come into contact with the pulleys 36, 37 and 38, are preferably stainless steel which is hardened so that dust particulate due to wear is not produced. The set of three pulleys 36, 37 and 38 together support the carrier 3.

Figure 5:
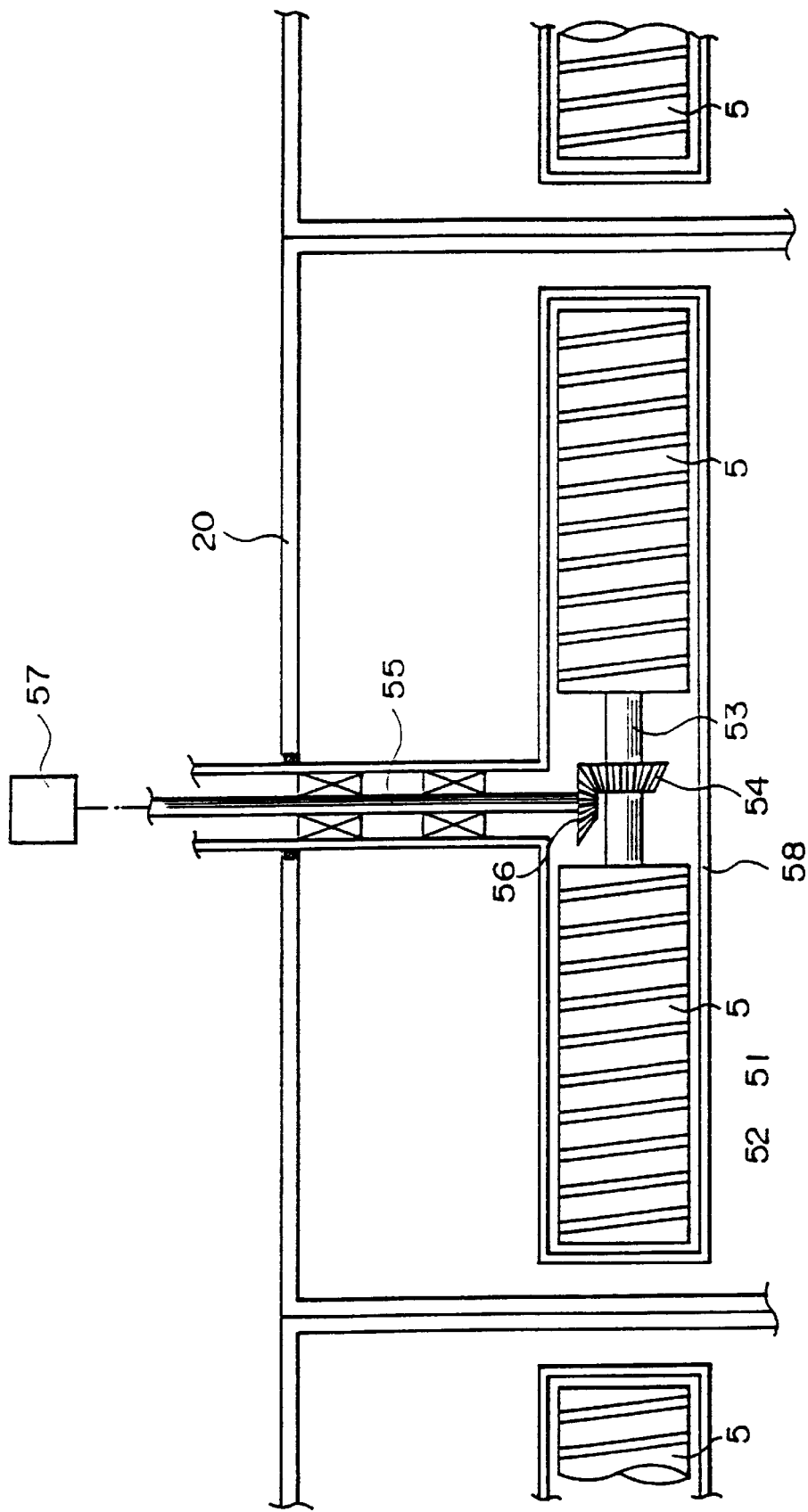
FIG. 5 is a schematic plan view of the transfer system for the in-line film deposition system of FIG. 1.

The transfer system is described in further detail with reference to FIGS. 4 and 5. Two of the magnetic coupling rollers 5 which are described above are arranged along the transfer direction as shown in FIG. 5. The two magnetic coupling rollers 5 are coupled together by a connection rod 53. A bevel gear 54 is provided at a substantially central position on the connection rod 53. A drive shaft 55 is disposed orthogonally so as to intersect the connection rod 53. A bevel gear 56, at the end of the drive shaft 55, engages the bevel gear 54 of the connection rod 53. The drive shaft 55 is coupled to a driving motor 57 by a connection mechanism that is not shown in FIG. 5. The drive shaft 55 is rotated by the driving motor 57 around the center of the drive shaft 55, which serves as the axis of rotation.

When the drive shaft 55 is rotated by the driving motor 57 rotation is transmitted to the threaded parts of the bevel gears 54 and 56, so that the connection rod 53 is rotated. The magnetic coupling rollers 5 at either end of the connection rod 53 are rotated by this drive rotation and consequently the carrier 3 is moved as described above.

The magnetic coupling rollers 5 are arranged inside an external cylindrical cover 58. The external cover 58 serves to prevent the exposure of the magnetic coupling rollers 5 to the vacuum atmosphere in the vacuum chambers 2. That is, as is shown in FIG. 41 the external cover 58 extends through the wall of the vacuum container 20 to the outside. The external cover 58 is provided to prevent the interior of the vacuum container 20 from being contaminated by dust particulates such as grease that are produced upon the engagement of the bevel gears 54 and 56. The external cover 58 is made of a material with high magnetic permeability, such as, stainless steel SUS 301 or SUS 304 or aluminum, so that the carrier side magnets 39 and the magnetic coupling rollers 5 can fully engage each other.

An assembly which includes two magnetic coupling rollers 5, the connection rod 53 for connecting these magnetic coupling rollers 5, the external cover 53, the drive shaft 55, the connection mechanism, not shown, and the driving motor 57 is disposed in each of the vacuum chambers 2 shown in FIGS. 1(*a*) and 1(*b*). This assembly in the vacuum chambers 2 serves to move the carrier 3 in the vacuum chambers and between the vacuum chambers.

A configuration of the rotation mechanism arranged in the rotation chambers 251, 252, 253, and 254 is described below. The rotation mechanism shown in FIG. 6 includes a holding member 61, which holds a drive mechanism (referred to hereafter as a "linear motion mechanism") for the magnetic coupling rollers 5, and a rotation motor 621, for rotating the holding member 61 so as to rotate the carrier 3 together with the linear motion mechanism.

Figure 6:
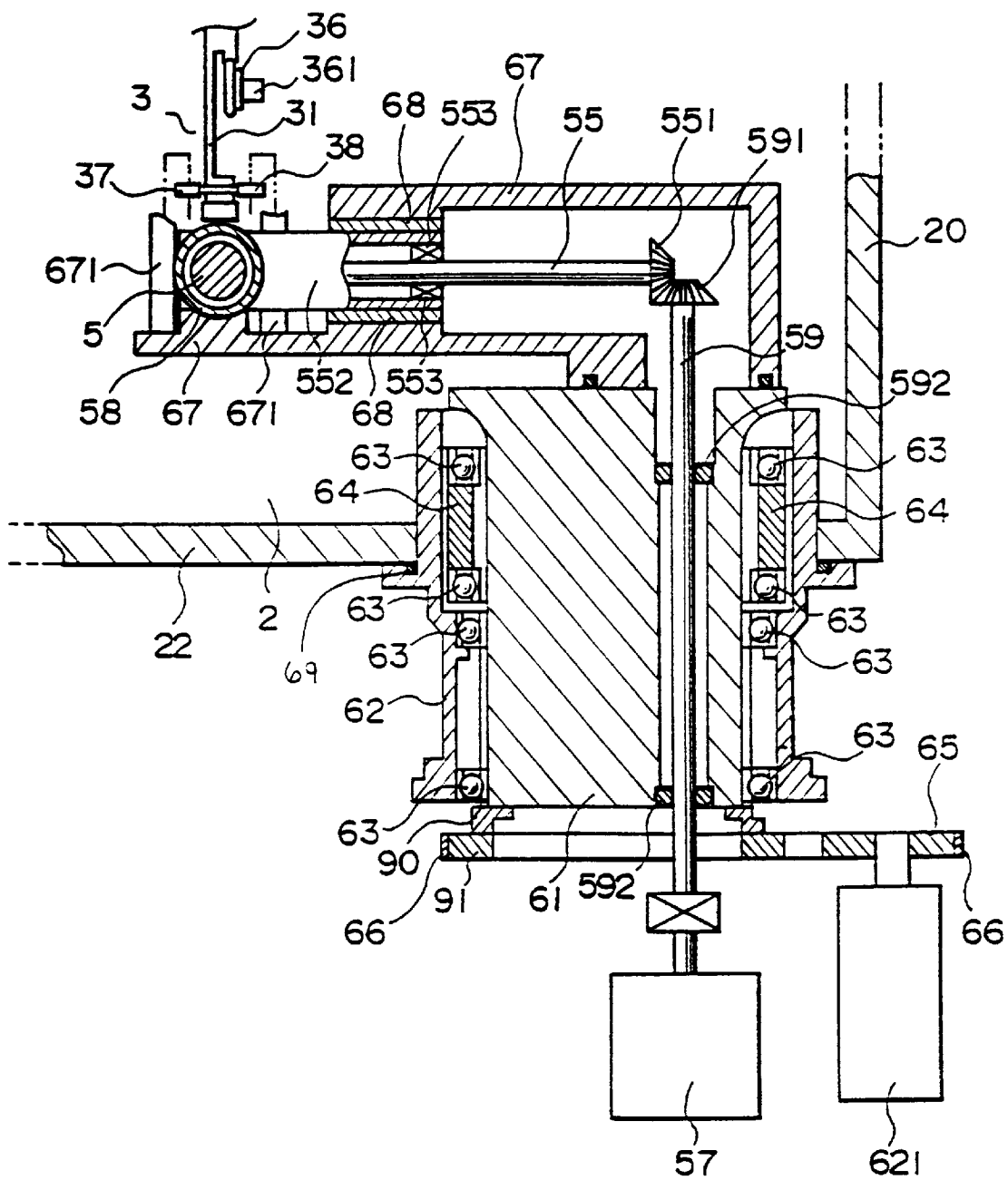
FIG. 6 is a schematic side view of the rotation mechanism for the in-line film deposition system of FIG. 1.

Two magnetic coupling rollers 5 and the connection rod 53 which connects these magnetic coupling rollers 5 are arranged in the rotation chambers 251, 252, 253, and 254 shown in FIGS. 1(*a*) and 1(*b*). The connection rod 53 is connected to the drive shaft 55 through the bevel gears 54 and 56, in the manner which is shown in FIG. 5. Another bevel gear 551 is provided at the rear end of the drive shaft 55, as shown in FIG. 6. This bevel gear 551 engages a bevel gear 591 that is provided on the end of a power transmission rod 59, which is set in a vertical position. The output shaft of the driving motor 57 is connected to the rear end of the power transmission rod 59.

The holding member 61 is generally arranged as a column with a vertical axis. In the holding member 61 there is a through hole in the vertical direction, as is shown in FIG. 6, into which the power transmission rod 59 is inserted. Bearings 592 are arranged in a clearance between an internal surface of the through hole and the power transmission rod 59. The bearings 592 hold the power transmission rod 59 in the through hole while allowing rotary motion of the power transmission rod 59.

The holding member 61 is arranged in a holding member cover 62 having a larger diameter than the holding member 61. The holding member cover 62, which accommodates the holding member 61, is installed on the bottom wall 22 of each of the rotation chambers. The bottom wall 22 of the rotation chambers are provided with openings which fit the outside diameter of the holding member covers 62. The holding member cover 62 is fixed in this opening. A seal member, such as an 0-ring 69, is provided at the interface between the holding member cover 62 and the bottom wall 22.

Four bearings 63 and a mechanical seal 64 are disposed in a clearance between the holding member cover 62 and the internal holding member 61. The mechanical seal 64 vacuum-seals the clearance between the holding member 61 and the holding member cover 62. The mechanical seal 64 is preferably a sealing mechanism using a magnetic fluid.

A pulley fixture 90 is provided on the lower surface of the holding member 61. At the lower edge of the pulley fixture, a pulley 91 is attached. The pulley 91 is arranged concentrically with the central axis of the holding member 61. In addition, the pulley 65 is arranged on the same plane as the pulley 91. The output shaft of the rotation motor 621 is connected to the pulley 65, and a belt 66 is mounted on the pulleys 65 and 91 so that rotation of the pulley 65 causes the holding member 61 to be rotated about its axis. The pulleys 91 and 65 are preferably timing pulleys and the belt 66 is preferably a timing belt.

A moving mechanism holding frame 67, as shown in FIG. 6, is fixed on the upper surface of the holding member 61. The moving mechanism holding frame 67 holds the carrier 3 and the magnetic coupling roller 5. Two struts 671 are arranged at a lower portion of the end of the moving mechanism holding frame 67, as shown in FIG. 6. The pulleys 36, 37 and 38 are held by these struts 671 through a shaft. A drive shaft cover 552 which houses the drive shaft 55, is inserted into the moving mechanism holding frame 67. Several bearings 553 are arranged in a clearance between the drive shaft 55 and the drive shaft cover 552. A vacuum sealing part 68 is provided between the drive shaft cover 552 and the moving mechanism hold frame 67. The vacuum sealing part 68 serves to isolate the interior of the moving mechanism hold frame 67 from the vacuum chamber 2.

Operation of the linear motion mechanism and the rotation mechanism are as follows. When the driving-motor 57 is driven, the drive rotation is transmitted through the power transmission rod 59, the drive shaft 55, and the connection rod 53, causing the magnetic coupling rollers 5 to rotate. This rotation of the magnetic coupling rollers 5 causes the carrier 3 above the magnetic coupling rollers 5 to move.

When the entire carrier 3 is positioned above the magnetic coupling roller 5 that is arranged in the rotation chamber, the rotation motor 621 is driven. The rotary motion of the rotation motor 621 is transmitted from the pulley 65 to the pulley 91 by the belt 66, so that the pulley 91 rotates. The holding member 61 on the pulley 91 is rotated by the rotation of the pulley 91. The entire linear motion mechanism that is held on the holding member 61 is rotated by the rotation of the holding member 61. Consequently, the carrier 3 that is loaded on the linear motion mechanism is also rotated. When the rotation angle of the holding member 61 reaches 90°, the rotation of motor 621 stops. Accordingly, the transfer direction of the carrier 3 is changed by 90°.

Subsequently, the linear motion mechanism is driven to transfer the carrier 3 to the next vacuum chamber 2 in the transfer direction which has been changed by 90° from the previous transfer direction. Accordingly, on the transfer path 30, the direction of which is changed by 90°, the planar surfaces of the substrate 1 are kept parallel to the transfer direction during the entire transfer of the carrier 3.

Rotation of the rotation mechanism is preferably controlled by the rotation motor 621. Alternately, the rotation can be controlled by a sensor mechanism, not shown, which detects the rotation of the holding member 61 at a specified angle.

Component parts of the rotation mechanism are not exposed to the vacuum atmosphere in the vacuum container 20. Therefore, dust particulate produced from the friction generated by these component parts is prevented from contaminating the vacuum chamber 2.

A configuration for processing means 4 is illustrated in FIG. 4 including a cathode mechanism for magnetron sputtering. The cathode mechanism shown in FIG. 4 comprises a disc-shaped cathode body 41 on which a pair of magnets 43 and 44 are mounted through a yoke 46, and a disc target 42 that is provided in front of these magnets 43 and 44. A motor 47 for rotating the yoke 46 on which the pair of magnets 43 and 44 are provided is mounted on the outside of the cathode body 41. A DC power supply 45 for applying a voltage to the cathode mechanism is connected to the yoke 46. Target 42 is set to approximately twice the diameter of the substrate 1 to carry out simultaneous film deposition on the two substrates 1 held on the carrier 3 by one cathode mechanism.

The magnet 43 is disposed at the center of the yoke 46 and a ring shaped magnet 44 is disposed around the magnet 43. The preferred shapes and arrangement of the magnets 43 and 44 are described in detail in U.S. Pat. No. 5,047,130, however, other shapes and arrangements may also be used. A magnetic path is formed between the center magnet 43 and the ring shaped magnet 44. Arched lines of magnetic force are produced on the target 42 by the center magnet 43 and the ring shaped magnet 44. While at the same time, a DC voltage is applied to the yoke 46 by the power supply 45 and an electric field is produced between the substrate 1 to be grounded and the target 42. When the electric field orthogonally intersects the lines of magnetic force produced by the pair of magnets 43 and 44, a magnetron discharge occurs.

The vacuum chamber 2 is provided with a gas introduction system, not shown, for introducing a process gas, such as, argon therein. The introduced argon gas is ionized and the above-described magnetron discharge occurs.

Other processing means 4 which may be included in the vacuum chambers 2 include a heating mechanism for heating the substrate, an etching mechanism for shaving off the impurities naturally growing on the surface of the substrate, and a cooling mechanism for cooling the substrate which is heated during the film deposition processing. The heating mechanism is preferably an infrared lamp which heats the substrate with radiant heat. The etching mechanism includes a gas mechanism for introduction of an etching gas, and an electrode mechanism to which a voltage is applied. The cooling mechanism is a cooling panel on which a winding pipe for circulating an refrigerant is provided. The substrate is cooled by circulating a gas with excellent heat conductivity, such as hydrogen gas, between the cooling panel and the substrate.

Side walls of the vacuum containers 20 which are provided with the processing means 4 are adapted so that one or more of these side walls may be opened by rotating the wall around the wall side edge which serves as an axis. These side walls are opened as is shown in FIG. 1(a) for maintenance, and for repair following a failure of the processing means 4, for example, to replace a worn-out target 42.

The loading chamber 23 and the unloading chamber 24 for use in the system shown in FIGS. 1(a) and 1(b) operate as follows. The loading chamber 23 is the vacuum chamber in which the substrate 1 is loaded on the carrier 3. A vacuum transferring robot 231 is mounted in the loading chamber 23.

Figure 10A:
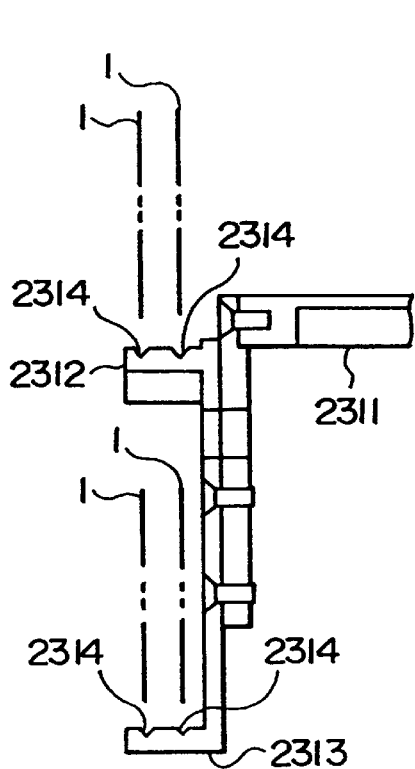
FIG. 10(*a*) is a side cross sectional view of a hook for an arm of a transfer robot.

The vacuum transferring robot 231 does not produce dust particulates even during operation in the vacuum. One such robot is the UTV-2000 of MECS CORP. which is illustrated in FIG. 1(a). The substrate 1 for which film deposition is carried out is preferably a hard disk having a circular opening at the center for a magnetic recording medium. The two substrates 1 are held by the transferring robot 231 which is shown in FIG. 10(a) in such a manner that an upper hook 2312 of an arm 2311 is inserted into the center opening of the substrate 1 and a lower hook 2313 is positioned under the lower edge of the substrate 1. The transferring robot 231 lifts two substrates 1 at a time by these hooks.

Figure 10B:
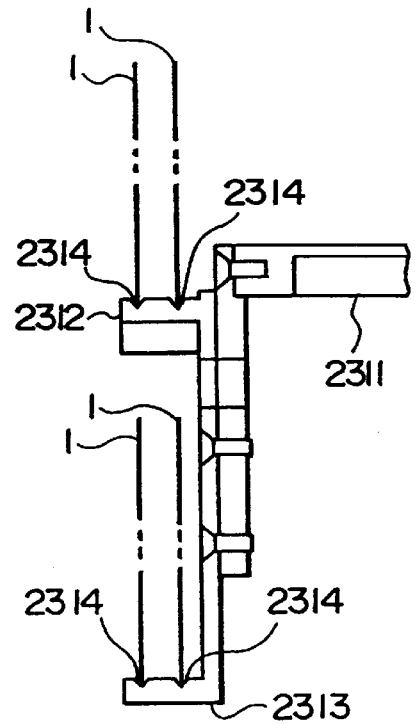
Figure 10C:
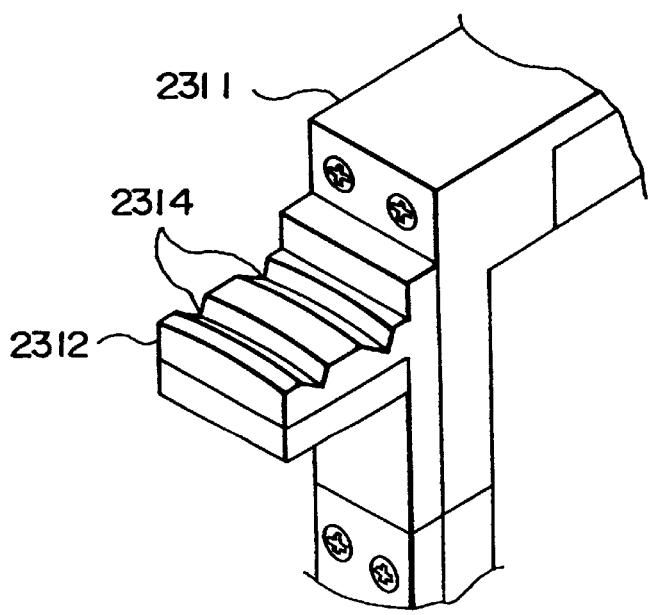

As shown in FIG. 10(b), two grooves 2314 are formed on the upper surfaces of hooks 2312 and 2313 of the arm 2311. The arm 2311 holds the substrates 1 by fitting the edges of the substrates 1 into these grooves 2314. Accordingly, even if the vacuum transferring robot 231 rotates and the arm 2311 is shaken, the substrates 1 will not come off the end part of the arm.

A sub-loading chamber 232 is arranged adjacent to the loading chamber 23 through the gate valve 21. This sub-loading chamber 232 accommodates one lot of substrates 1 (generally, 25 substrates). A cassette 234 supports the lower edges of substrates 1, lining them up in a parallel position. As shown in FIGS. 1(a) and 1(b), an atmosphere transferring robot 235 moves to the front of a cassette 234 in which one lot of substrates 1 is held. An arm 2351 of the atmosphere transferring robot 235 picks up one lot of substrates 1 in a cassette 234 and rotates to face the gate valve 233. The gate valve 233 is opened and the atmosphere transferring robot 235 transfers a full lot of substrates 1 to the sub-loading chamber 232 at one time. Two sub-loading chambers 232 are provided on the two external side walls of the loading chamber 23.

When the gate valve 233 is closed, the interior of the sub-loading chamber 232 is vacuum-evacuated by an exhaust system (not shown). After vacuum evacuation, the gate valve 21 between the sub-loading chamber 232 and the loading chamber 23 opens.

The arm 2311 of the transferring robot 231 in the loading chamber 23 enters the center opening of two of the substrates 1 that are in the sub-loading chamber 232 and lifts the two substrates 1. The arm 2311, which holds two substrates 1, then exits the sub-loading chamber 232 and rotates to direct the arm 2311 toward the carrier 3. The arm 2311 is extended to set one of the two substrates 1 at a position that is slightly above the set of finger plates 32, 33, 341 and 35 that are arranged at the left side, as is shown in FIG. 2. The arm 2311 lowers the substrate 1 so that it is supported by the finger plates 32 and 35.

The other substrate 1 is placed and held by a set of finger plates 32, 33, 34 and 35 arranged at the right side of the carrier 3 according to a similar operation of the transferring robot 231, as shown in FIG. 2. When the loading of the two substrates 1 on the carrier 3 is completed, the loading operation is finished. The carrier 3, which holds the two substrates 1, is then transferred by the transfer system.

The atmospheric pressure in the one sub-loading chamber 232 is returned to normal while the substrates 1 in the other sub-loading chamber 232 are loaded on the carrier 3 by the transferring robot 231. As is described above, one lot of substrates 1 are transferred from the cassette 234 into the other sub-loading chamber 232 by the atmosphere transferring robot 235. After the loading of all the substrates 1 in one sub-loading chamber 232 onto the carrier 3 is completed, the loading of the substrates 1 in the other sub-loading chamber 232 onto the carrier 3 is started. Substrate loading operations from the sub-loading chambers 232 are carried out alternatively.

As shown in FIGS. 1(a) and 1(b), the unloading chamber 24 is arranged adjacent to the loading chamber 23. This unloading chamber 24 is a vacuum chamber for unloading the film-deposited substrates 1 from the carriers 3. A vacuum robot 241, which is the same as the vacuum robot 231 in the loading chamber 23 is mounted in the unloading chamber 24. Two sub-unloading chambers 242 are provided on the two external side walls of the unloading chamber 24.

The film-deposited substrates 1 held on the carrier 3 are transferred to the unloading chamber 24 by the transfer system as follows. The arm 2411 of the transferring robot 241 is inserted into the center opening of the left side substrate 1 and lifts the substrate 1 from the set of finger plates 32, 33, 34 and 35 on the left side, as is shown in FIG. 2. The right side substrate 1 held by the carrier 3 is removed by a similar operation by the transferring robot 241. The transferring robot 241 which holds two substrates 1 rotates to direct the arm 2411 toward the sub-unloading chamber 242 which has been vacuum-evacuated. The gate valve 21 of the sub-unloading chamber 242 is opened and the arm 241 enters the sub-unloading chamber 242 through the gate valve. The two film-deposited substrates 1 are stored in the sub-unloading chamber 242.

When the number of film-deposited substrates 1 is the equivalent of one lot, the interior pressure in the sub-unloading chamber 242 is returned to normal atmospheric pressure. The gate valve 243 is opened and the one lot of substrates 1 is taken out of the sub-unloading chamber 242 by the atmosphere transferring robot 235 and transferred to a cassette 234. At this time, the transferring robot 231 unloads the substrates 1 into the other of the sub-unloading chambers 242. Accordingly, the unloading operation can be efficiently carried out by alternately using the sub-unloading chambers 242, as was done during the loading operation.

The carrier 3 from which the substrates 1 have been unloaded is transferred from the unloading chamber 24 directly to the loading chamber 23 through the gate valve 21, and the loading operation is carried out again in the loading chamber 23. In other words, the carrier 3 is endlessly circulated along a square-shaped transfer path.

Figure 7:
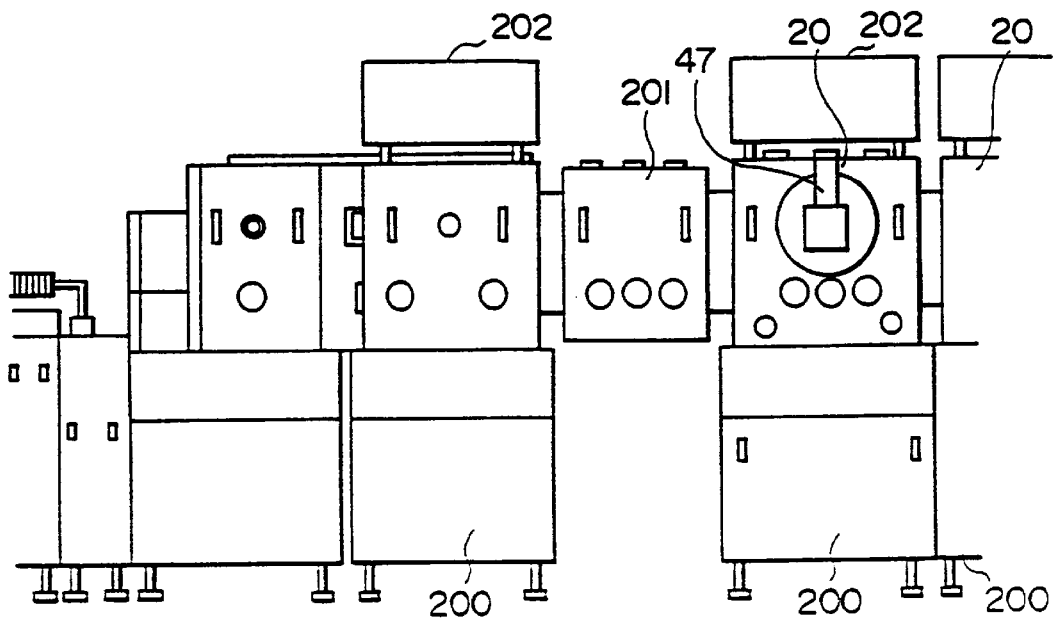
FIG. 7 is a side view of a portion of the in-line film deposition system of FIG. 1.

FIG. 7 is a side view of the system shown in FIG. 1. As is shown in FIG. 7, a frame 200 is arranged below each of the vacuum containers 20 except the vacuum container 201. The vacuum container 201 is suspended between the vacuum containers 20 at either side creating a space which allows an operator to pass under the suspended vacuum container 201. The operator can enter the inside of the system through this space to easily perform maintenance and repair of the processing means 4 which are provided on the inside wall of the vacuum container 20. A box 202 which contains a vacuum gauge, a gate valve controller, a mass flow controller and a power supply is mounted on the vacuum container 20. An exhaust system, such as a cryo pump that is attached to the bottom wall of each of the vacuum containers 20, is contained in the frame 200.

Film deposition on a hard disk for high density recording by using the in-line film deposition system according to a preferred embodiment of the present invention is briefly described below. In the in-line film deposition system of this embodiment, film deposition on the hard disk is completed through the processes of etching, heating, multi-layer thin film deposition, and cooling.

The etching process is carried out in the process chamber A in FIG. 1(a). The processing means 4 for the process chamber A includes a radio frequency voltage application mechanism and a discharge gas introduction system for introducing a discharge gas, such as, argon. Preferably a 3.5-inch aluminum disk is etched as the substrate 1 in the process chamber A. During the etching process, oxide impurities and water molecules remaining on a base film layer, for example, an NiP film deposited on the surface of the disk, are removed. In the etching process, the disk is sputter-etched by a plasma produced by applying a radio frequency (rf) voltage through the carrier 3. The surface of the disk is cleaned by this etching.

Subsequently, a heating process is carried out in the process chamber B. The processing means 4 for the process chamber B includes an infrared lamp and a power supply mechanism for the infrared lamp. The disk is preferably heated to approximately 350° C in the process chamber B. Heating is carried out for the satisfactory crystalline growth of the thin film in the following thin film deposition process.

After heating, a Cr film deposition process is carried out in the process chamber, such as, the chamber shown in FIG. 4C. The processing means 4 for the process chamber C includes a cathode mechanism having a Cr target 42, and the discharge gas (argon gas) introduction system. A Cr thin film having a thickness of approximately 700 angstrom is deposited on the surface of the disk. The Cr film deposition is carried out by sputtering the Cr target 42 with the discharge gas.

Subsequently, a CoCrTa alloy film deposition process is carried out in the process chamber D. The processing means 4 for the process chamber D includes a cathode mechanism having the CoCrTa alloy target 42, and the discharge gas (argon gas) introduction system. Deposition of the CoCrTa thin film is carried out by sputtering the CoCrTa alloy target 42 with the discharge gas. A CoCrTa alloy thin film having a thickness of approximately 300 angstrom is deposited on the Cr film layer. During the CoCrTa alloy film deposition process, a bias voltage of approximately −300 V is applied to improve the crystallinity of the CoCrTa alloy film.

A cooling process is carried out in the process chamber E. The processing means 4 for the process chamber E includes a cooling mechanism that is provided with a cooling panel. The heated disk is preferably cooled to approximately 150° C. by this cooling mechanism. The disk is cooled to raise the density of the carbon film in a following carbon film deposition process.

Finally, a carbon film deposition process is carried out in the process chamber F. The processing means 4 for the process chamber F includes the cathode mechanism having a carbon target 42, a reaction gas (methane gas and hydrogen gas) introduction system, and a discharge gas (argon gas) introduction system. A carbon thin film having a thickness of approximately 200 angstrom is deposited on the CoCrTa alloy film layer by reactive sputtering in a gas mixture comprising argon gas, methane gas, and hydrogen gas. The carbon film is a passivation film for the multi-layer film comprising the Cr layer and the CoCrTa alloy layer.

The transfer of the carrier 3 is stopped in a process chamber during the processing step in the respective process chambers and therefore the disk is processed while held stationary. However, the film deposition processing may also be carried out while the carrier 3 is moving, depending on the kind of thin film and the processing conditions.

The processing time in each process chambers may differ depending on the function of the particular process chamber. In such a case, a waiting chamber where a carrier 3 stays temporarily can be provided between the process chambers to compensate for a difference in the time that is required for film deposition processing. Otherwise the carrier 3 may stay for a specified time in the respective process chambers or in the rotation chambers 251, 252, 253 and 254.

As is described above, the in-line film deposition system according to the present invention is advantageous in that the length of this system can be substantially reduced as compared with the conventional system in which the vacuum chambers are provided in a linear arrangement. In recent years, film deposition processes have become more complicated and, therefore, it is necessary to continuously carry out a number of film deposition processes on a single substrate 1. However, according to the in-line film deposition system of this embodiment, the length of the system will not be excessively long even if the number of process chambers is increased.

Figure 8:
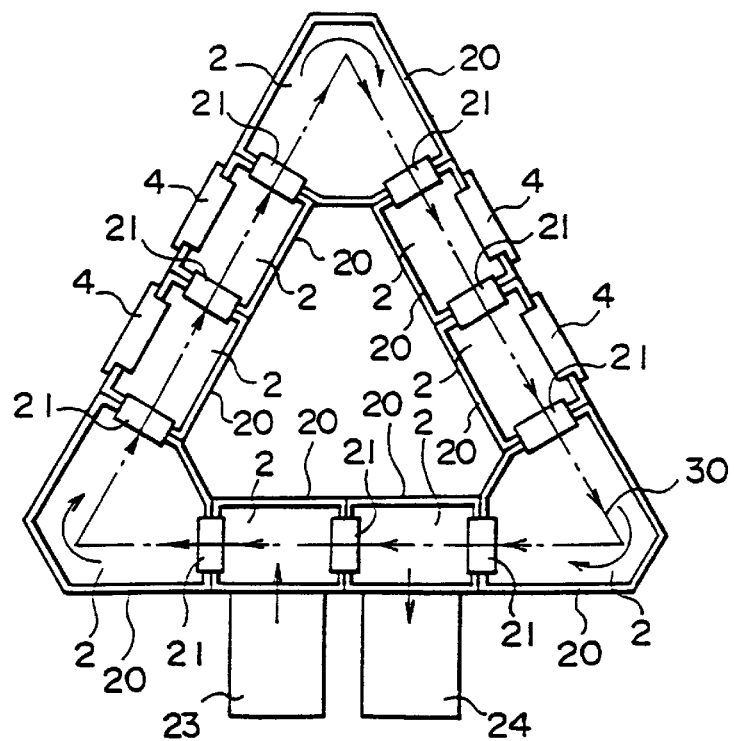
FIG. 8 is a schematic plan view of the in-line film deposition system according to another embodiment of the present invention.
Figure 9:
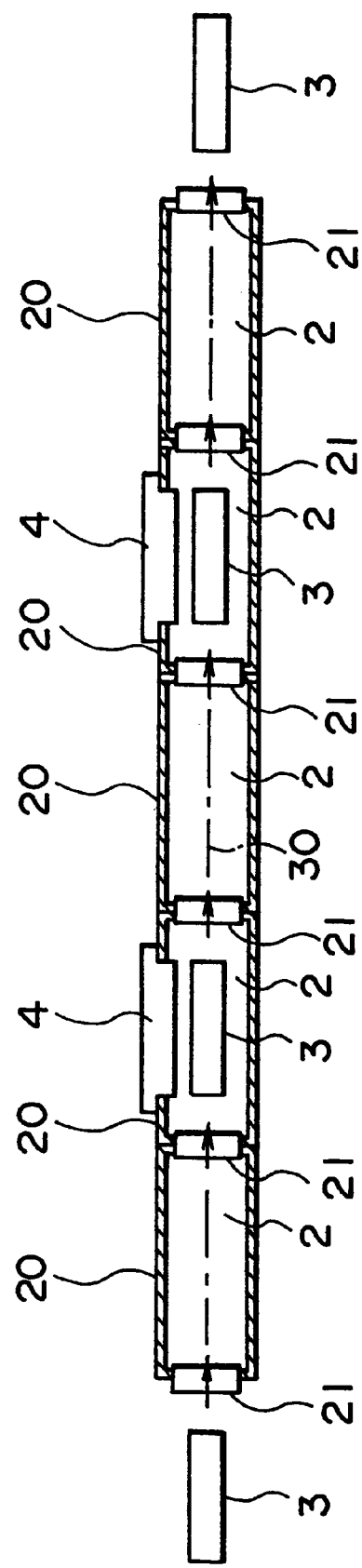
FIG. 9 is a schematic plan view of a conventional in-line film deposition system.

Another embodiment according to the present invention is described below with respect to FIG. 8 which is a schematic plan view illustrating another configuration of the present invention. In this embodiment, a plurality of vacuum chambers 2 are arranged along a triangular transfer path 30 that passes through the gate valves 21. In each vacuum chamber located at the respective angular corners of the transfer path is mounted a rotation mechanism (not shown in FIG. 8), as is described above. In this embodiment, the carrier 3 is rotated 120 degrees by the rotation mechanism.

The vacuum chambers 2 arranged on two sides of the triangular transfer path are the respective film deposition process chambers in which are arranged the processing means 4. In this example, a total of four process chambers are so arranged, two on each of the two sides. The two vacuum chambers 2 that are arranged on the remaining side are the loading chamber 23 and the unloading chamber 24. In the loading chamber 23 and the unloading chamber 24, the sub-loading chamber 232 and the sub-unloading chamber 242 (not shown in FIG. 8) are arranged as described above with respect to the first embodiment.

In the system according to this embodiment, the specified film deposition processing is continuously carried out in the process chambers through which the carrier 3 is transferred along the triangular transfer path 30.

Thus, the "polygonal transfer path" according to the present invention, can have any shape including a triangle, square, pentagon, hexagon and others.

In the case of the rectangular transfer path 30 as shown in FIG. 1, a planar shape of the space required by the system is substantially rectangular shaped. The rectangular-shaped system is preferable in that the manufacturing floor space of the clean room can be minimized.

In the systems for the above-described embodiments, the carrier 3 simultaneously holds two substrates 1. A carrier 3 that is capable of holding more than two substrates will further improve productivity of the system.

In the above-described embodiments, the loading of the substrate onto and the unloading of the substrates from the carrier 3 can be carried out in one vacuum chamber 2. In which case, the loading and the unloading of the substrates 1 can be performed by one vacuum transferring robot 231.

In the above-described embodiments, the processing means 4 is provided on both the outside wall and the inside wall of the vacuum container 20 to simultaneously carry out film deposition on both surfaces of the substrate 1. The processing means 4 are opposed with the transfer path lying between them. However, for film deposition on only one side of the substrate 1, the processing means 4 may be arranged only on one side wall of the vacuum container.

The present invention can be employed even if the substrates 1 are other types of disks, such as, optical disks or optical magnetic disks. The in-line film deposition system according to the present invention is also applicable to film deposition on non-disk substrates, such as, substrates for LSI (large scale integration) and for LCDs (liquid crystal displays).

As is described above, the in-line film deposition system according to the present invention is advantageous in that the system can be prevented from being excessively long, even if the film deposition on the substrate requires a number of processing steps. Therefore, the system effectively occupies only a limited amount of floor space in a clean room.

While the present invention has been described in accordance with certain preferred embodiments thereof, it is recognized that various changes and modifications can be made, and equivalents employed without departing from the spirit and scope of the invention.

What is claimed is:

1. A method of film deposition in an apparatus having a plurality of vacuum chambers including a loading chamber, an unloading chamber, at least one processing chamber and at least one rotation chamber and a continuous looped line transfer path extending through the plurality of vacuum chambers, the method comprising the steps of:

loading a substrate on a carrier in the loading chamber;

transferring the carrier and the substrate along the continuous looped line transfer path through the plurality of vacuum chambers such that the substrate and carrier pass only once through each of the vacuum chambers, and the substrate and carrier do not travel in reverse direction of travel throughout the rotation chamber;

depositing a film on the substrate in the processing chamber;

changing a direction of transfer of the carrier and the substrate in the rotation chamber with a rotation mechanism; and unloading the substrate in the unloading chamber.

2. The method of film deposition according to claim 1, wherein the loading chamber and the unloading chamber are arranged adjacent to each other.

3. The method of film deposition according to claim 1, wherein the substrate is transferred by a transfer system including a magnetic coupling roller magnetically coupled to a substrate carrier.

4. The method of film deposition according to claim 1, wherein the substrate is transferred with a planar surface of the substrate maintained parallel to a transfer direction.

5. The method of film deposition according to claim 1, wherein the substrate is processed on both sides by two sets of processing means arranged opposite each other with the transfer path lying between them.

6. The method of film deposition according to claim 1, wherein the substrate is transferred along a transfer path which is polygonal in shape.

7. The method of film deposition according to claim 1, wherein the transferring step includes magnetically coupling the carrier with a magnetic coupling roller and rotating the magnetic coupling roller to impart linear motion to the carrier.

8. The method of film deposition according to claim 7, wherein the changing a direction of transfer step includes moving the magnetic coupling roller from a first location to a second location.

9. The method of film deposition according to claim 1, wherein only one transfer path extends through all of the vacuum chambers.

10. The method of film deposition according to claim 9, wherein the changing a direction of transfer step includes moving the magnetic coupling roller from a first location to a second location.

11. The method of film deposition according to claim 1, wherein the substrate and carrier do not change a direction of travel within any of the processing chambers.

12. A method of film deposition in an apparatus having a plurality of vacuum chambers including a loading/unloading chamber, at least one processing chamber, and at least one rotation chamber, and a continuous looped line transfer path extending through the plurality of vacuum chambers, the method comprising the steps of:

loading a substrate on a carrier in the loading/unloading chamber;

transferring the carrier in the substrate along the continuous looped line transfer path through the plurality of vacuum chambers such that the substrate and carrier pass only once through the processing chamber and the rotation chamber, and the substrate and carrier do not travel in reverse directions of travel throughout the rotation chamber;

depositing a film on the substrate in the processing chamber;

changing a direction of transfer of the carrier and the substrate in the rotation chamber with a rotation mechanism; and unloading the substrate in the loading/unloading chamber.

13. The method of film deposition according to claim 12, wherein the transferring step includes magnetically coupling the carrier with a magnetic coupling roller and rotating the magnetic coupling roller to impart linear motion to the carrier.

14. The method of film deposition according to claim 12, wherein only one transfer path extends through all of the vacuum chambers.

15. The method of film deposition according to claim 12, wherein the substrate and carrier do not change a direction of travel within any of the processing chambers.

16. A method of film deposition in an apparatus having a plurality of vacuum chambers including a loading chamber, a plurality of processing chambers, at least one rotation chamber, and a continuous looped line transfer path extending through the plurality of vacuum chambers, the method comprising the steps of:

loading a substrate on a carrier in the loading chamber;

transferring the carrier and the substrate along the continuous looped line transfer path through a first one of the plurality of processing chambers such that the carrier and substrate pass through the first one of the processing chambers in a straight line without changing a direction of travel;

depositing a film on the substrate in the first one of the processing chambers;

continuing to transfer the carrier and the substrate along the continuous looped line transfer path from the first one of the plurality of processing chambers into the rotation chamber;

changing a direction of transfer of the carrier and the substrate in the rotation chamber by 90 degrees a rotation mechanism by pivoting a portion of the continuous looped line transfer path from a first location adjacent to the first processing chamber to a second location adjacent to a second one of the plurality of processing chambers, such that the carrier and the substrate move from the first location to the second location;

continuing to transfer the carrier and the substrate along the continuous looped line transfer path through the second one of the plurality of processing chambers such that the carrier and substrate pass through the second one of the processing chambers in a straight line without changing a direction of travel;

depositing a film on the substrate in the second one of the processing chambers;

unloading the substrate; and wherein the substrate passes only once through each of the processing chambers.

17. The method of film deposition of claim 16, wherein the continuous looped line path includes a magnetic coupling roller.

* * * * *